United States Patent
Todt et al.

(10) Patent No.: US 12,355,207 B1
(45) Date of Patent: Jul. 8, 2025

(54) EFFICIENT LASER SYSTEM

(71) Applicant: II-VI Delaware, Inc., Wilmington, DE (US)

(72) Inventors: René Todt, Wilmington, DE (US); Riyaz Mohammed Abdul Khadar, Wilmington, DE (US)

(73) Assignee: II-VI Delaware, Inc., Wilmington, DE (US)

( * ) Notice: Subject to any disclaimer, the term of this patent is extended or adjusted under 35 U.S.C. 154(b) by 0 days.

(21) Appl. No.: 18/800,495

(22) Filed: Aug. 12, 2024

(51) Int. Cl.
*H01S 5/10* (2021.01)
*H01S 5/00* (2006.01)

(52) U.S. Cl.
CPC .......... *H01S 5/1003* (2013.01); *H01S 5/0064* (2013.01)

(58) Field of Classification Search
CPC .......... H01S 5/16–168; H01S 5/1003
See application file for complete search history.

(56) References Cited

U.S. PATENT DOCUMENTS 9,755,402 B2 * 9/2017 Petrescu-Prahova ...... H01S 5/2031

* cited by examiner

*Primary Examiner* — Xinning(Tom) Niu
*Assistant Examiner* — Delma R Forde
(74) *Attorney, Agent, or Firm* — McAndrews, Held & Malloy, Ltd.

(57) ABSTRACT

The present disclosure comprises a laser semiconductor system, with the system comprising an n-side layer, an active region, a p-side waveguide layer, and a cladding layer. The system also comprises a plurality of sections, with at least a front section at the front of the semiconductor and a rear section at the rear of the semiconductor. A thickness of the p-side waveguide layer may increase monotonically in each of the plurality of sections in the direction from the front section to the rear section.

16 Claims, 4 Drawing Sheets

EFFICIENT LASER SYSTEM

TECHNICAL FIELD

The present disclosure generally relates to an efficient laser system.

BACKGROUND

Aspects of the present disclosure relate to an efficient laser system. Various issues may exist with conventional solutions for classification. In this regard, conventional laser systems may be costly, cumbersome, and/or inefficient.

Limitations and disadvantages of conventional systems and methods will become apparent to one of skill in the art, through comparison of such approaches with some aspects of the present methods and systems set forth in the remainder of this disclosure with reference to the drawings.

BRIEF SUMMARY OF THE DISCLOSURE

Shown in and/or described in connection with at least one of the figures, and set forth more completely in the claims is an efficient laser system.

These and other advantages, aspects and novel features of the present disclosure, as well as details of illustrated embodiments thereof, will be more fully understood from the following description and drawings.

BRIEF DESCRIPTION OF THE DRAWINGS

The various features and advantages of the present disclosure may be more readily understood with reference to the following detailed description taken in conjunction with the accompanying drawings, wherein like reference numerals designate like structural elements.

DESCRIPTION

Figure 1:
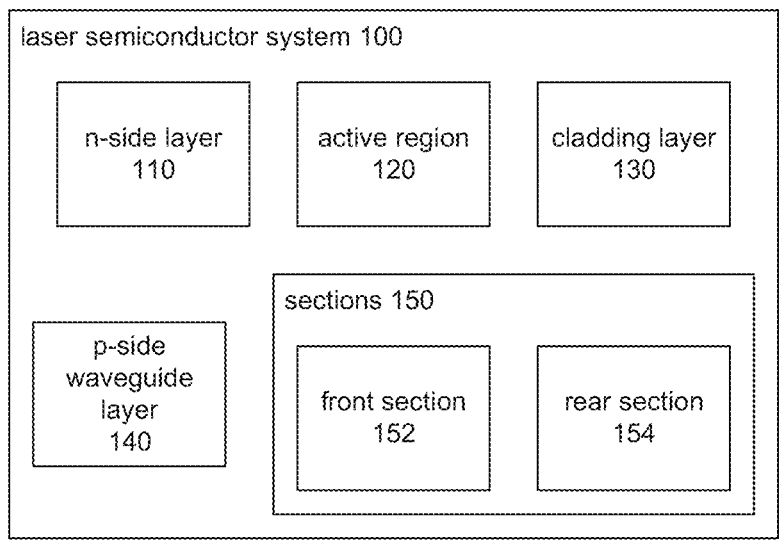
FIG. 1 a block diagram illustrating a laser semiconductor system, according to some embodiments of the present disclosure.

The following discussion provides various examples of an efficient laser system. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

In conventional laser systems, longitudinal spatial hole-burning and two-photon absorption may lead to a reduction in efficiency under high optical power and/or high current levels in high-power lasers. These two effects may predominantly happen in the front section of the device, since intracavity power levels may increase exponentially during the round-trip within the laser cavity. It may be desirable to address these disadvantages of conventional laser systems.

Embodiments of the present disclosure may comprise a laser semiconductor system, with the system comprising an n-side layer, an active region, a p-side waveguide layer, and a cladding layer. Embodiments may also comprise a plurality of sections, comprising at least a front section at the front of the semiconductor. Embodiments may also comprise a rear section at the rear of the semiconductor. In accordance with various embodiments, a thickness of the p-side waveguide layer may be monotonically increasing in each of the plurality of sections in the direction from the front section to the rear section.

In accordance with various embodiments, the system may comprise an anti-reflective coating at the front and/or rear of the semiconductor, and a highly reflective coating at the rear and/or front of the semiconductor. In accordance with various embodiments, the system may comprise a taper transition between two adjacent sections of the plurality of sections.

In accordance with various embodiments, the system may comprise a lateral structuring. Embodiments may also comprise one or more NAM sections. In accordance with various embodiments, the active region may be one of a bulk active region, a quantum well, or a quantum dot active region.

Embodiments may also comprise a confinement factor of an optical field of the active region in the front section so that it differs from a confinement factor of an optical field of the active region in the rear section by at least 10%. Embodiments may also comprise a length of each section of the plurality of sections so that it may be monotonically decreasing in each of the sections in the direction from the rear section to the front section.

In accordance with various embodiments, the thickness of the p-side waveguide layer in the front section may differ from the thickness of the p-side waveguide layer in the rear section by more than a $\frac{1}{30}$ of a wavelength of a desirable laser emission and by less than $\frac{1}{3}$ of a wavelength. Embodiments may also comprise a resistivity of each section of the plurality of sections so that it may be monotonically decreasing in each of the sections in the direction from the rear section to the front section.

In accordance with various embodiments, the resistivity of the front section may differ from the resistivity of the rear section by more than a $\frac{1}{30}$ and by less than $\frac{1}{3}$ of the resistivity of the front section. Embodiments may also comprise a thickness of the active region so that it may be unequal for two or more sections of the plurality of sections. Embodiments may also comprise a thickness of the active region of each section of the plurality of sections so that it may be monotonically decreasing in each of the sections in the direction from the rear section to the front section.

In accordance with various embodiments, the laser semiconductor may be operable in reverse polarity. In some embodiments, the n-side layer may act as a waveguide and the thickness of the n-side layer is monotonically increasing or decreasing in each of said plurality of sections in the direction from said front section to said rear section. In accordance with various embodiments, the thickness of said p-side waveguide layer may be substantially the same across said plurality of sections.

Referring now to FIG. 1, FIG. 1 is a block diagram that describes a laser semiconductor system 100, according to some embodiments of the present disclosure. A laser semiconductor system 100 may refer to a semiconductor operable to generate coherent laser light through the process of stimulated admission in a semiconductor material. It may generate a beam of light with a specific wavelength.

In some embodiments, the laser semiconductor system 100 may include an n-side layer 110, an active region 120, a p-side waveguide layer 140, a cladding layer 130, and a plurality of sections 150.

An n-side layer 110 may comprise an n-type semiconductor with excess electrons. A p-side layer 140 may comprise a p-type semiconductor with excess holes. An active region 120, sometimes referred to as the gain medium, may be a central component where the process of stimulated emission may occur. The stimulated emission may lead to the amplification of light and the generation of the laser beam. The active region 120 may be the region where the energy may be stored and then released in the form of photons. The active region 120 may be formed within a semiconductor material, for example a PN Junction, where the recombination of electrons and holes may lead to photon emission.

The active region 120 may be designed to have a specific energy level structure that may allow for efficient population inversion and stimulated emission at the desired wavelength. The active region 120 may also determine the gain characteristics of the laser semiconductor 100, and/or may determine the output power and spectral properties of the laser semiconductor system 100.

In some embodiments, the active region 120 may be one of a bulk active region, a quantum well active region, or a quantum dot active region.

A bulk active region may refer to an active region 120 comprising a single, relatively thick layer of semiconductor material. This may contrast with other types of active regions 120, such as quantum well active regions, which may comprise a plurality of thin layers of semiconductor material.

Quantum well active regions and quantum dot active regions may be structures to provide certain advantages using quantum confinement effects. Quantum well active regions may comprise multiple thin layers (wells) of semiconductor material with a lower bandgap typically sandwiched between layers of higher bandgap material. Electrons and holes may be confined to the wells in one dimension and this confinement may improve the efficiency of light emission and permit a narrower emission spectrum compared to bulk active regions.

Quantum dot active regions may comprise an array of small, three-dimensional islands (dots) of semiconductor material with the lower bandgap embedded within a higher bandgap material. Electrons and holes may be confined in all 3 dimensions within the dots, and may enhance the efficiency of light emission and narrower emission spectrum compared to bulk active regions and, in some instances, even quantum well active regions.

In some embodiments, a confinement factor of an optical field of the active region 120 in the front section 152 may differ from a confinement factor of an optical field of the active region 120 in the rear section 154 by at least 10%.

The confinement factor of an optical field in the active region of the laser may be a dimensionless parameter that quantifies the fraction of the optical power or energy that may be confined within the active region 120. The confinement factor may be indicative of various laser performance characteristics, for example, threshold current, efficiency, or temperature stability. The confinement factor may be adjusted, for example, by choosing advantageous physical properties of a waveguide layer 140. The confinement factor may depend on the thickness of the active region 120. The confinement factor may depend on the difference in refractive index between the active region 120 and surrounding layers. The confinement factor may depend on optical mode profiles.

Confinement and optical gain may also be modified in a lateral dimension to suppress higher order modes and/or enhance lower order modes. Lateral structures may be applied to one or more sections 150. Lateral structuring may be combined with tapering transitions.

A cladding layer 130 may be a layer of semiconductor material surrounding the active region 120. Commonly, there may be two cladding layers one at the top and one at the bottom of the laser semiconductor system 100 (only cladding layer 130 shown in the figures). The cladding layer 130 may have a lower refractive index than the active region 120. This difference in refractive index may create an optical waveguide, thus effectively trapping the light generated within the active region 120 and guiding it along the length of the laser cavity towards the ends of the laser semiconductor system 100. This may ensure efficient amplification of the light and may prevent the light from escaping sideways.

The cladding layer 130 may also help to confine the electrical current to the active region 120. This may be important to ensure efficient injection of electrons and holes into the active region 120, where the electrons and holes may recombine to produce light. Furthermore, the cladding layer 130 may also play a role in heat dissipation by removing excess heat generated during the operation of the laser semiconductor system 100. By carefully engineering the composition and thickness of the cladding layer 130 such strain compensation may improve the performance of the laser semiconductor system 100. Also, the cladding layer 130 may assist controlling the transverse modes of the laser system 100, thus assisting the emission of a single, well-defined beam of laser light.

The plurality of sections 150 may refer to different parts of the laser semiconductor system 100 comprising different physical properties. The sections 150 may comprise a different epitaxial growth structure, for example. The thickness of layers (e.g., an n-side layer 110, a p-side waveguide layer 140, an active region 120 etc.), or another physical dimension (e.g., a length in a medial or lateral direction) may differ. Generally, any two parts of the laser semiconductor system 100 that are physically different, may be referred to as different sections.

The plurality of sections 150 may include a front section 152 at the front of the semiconductor and a rear section 154 at the rear of the semiconductor. A thickness of the p-side waveguide layer 140 may be monotonically increasing or decreasing in each of the plurality of sections 150 in the direction from the front section 152 to the rear section 154. For example, a front section 152 may comprise a p-side waveguide layer 140 that may be thinner than a p-wide waveguide layer 140 of a rear section 154, while the other layers may be of a same thickness. In that case, thus, the front section 152 may be thinner than a rear section 154, as is also illustrated in FIG. 2.

Figure 2:
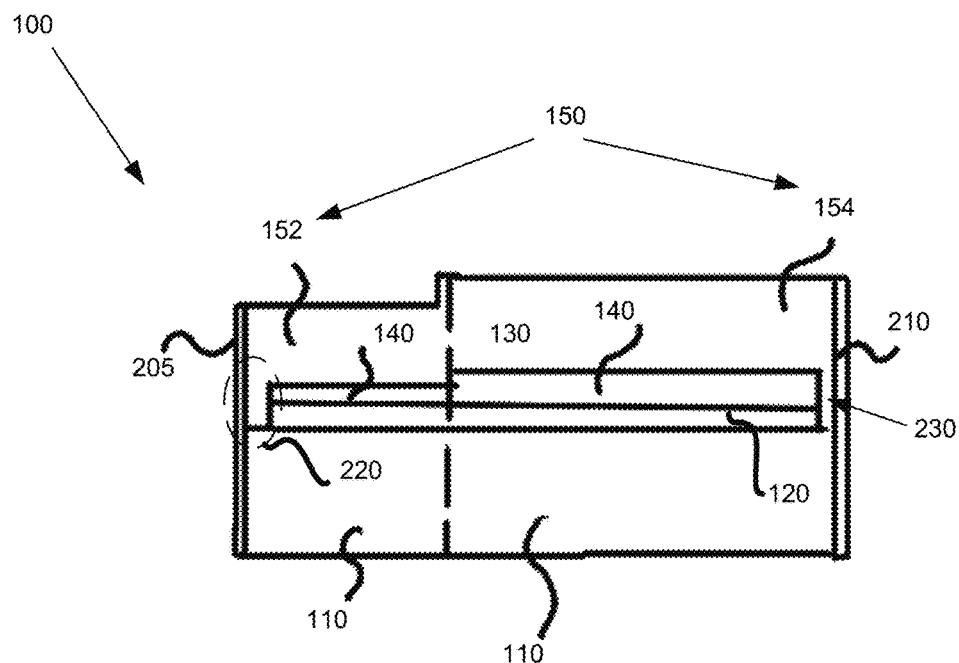
FIG. 2 shows an exemplary cross-section of a laser semiconductor system 100, according to some embodiments of the present disclosure.

In some embodiments, an anti-reflective coating at the front and/or rear of the semiconductor, and a highly reflective coating at the rear and/or front of the laser semiconductor system 100 may be used, as also illustrated in FIG. 2.

A highly-reflective coating may be operable to maximize the reflection of light. A highly-reflective coating may be applied to the facets of laser semiconductor system 100 to minimize light output at one end of the semiconductor, either the front or the rear end of the semiconductor. Typically, the anti-reflective coating may be at the front of the semiconductor, which may correspond to the light-emitting end. Typically, the highly-reflective coating may be at the rear of the semiconductor, which may correspond to the end that does not emit light. The highly-reflective coating may reflect the light back into the semiconductor, so that the light may exit at the other end of the laser semiconductor system 100.

At the end of the laser semiconductor system 100 where the generated light is supposed to exit the semiconductor, an anti-reflective coating may be used. Anti-reflective coating may be operable to permit the transmission of light through the facets of a laser semiconductor system 100.

Figure 4A:
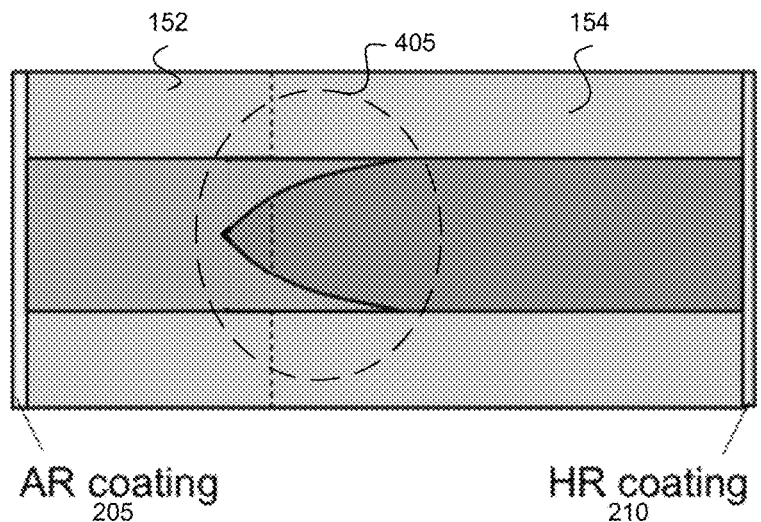
FIG. 4A, FIG. 4B, FIG. 4C show exemplary taper transitions 405, 410, 415 between a front section 152 and a rear section 154 in a top view of the laser semiconductor system 100, according to some embodiments of the present disclosure.
Figure 4B:
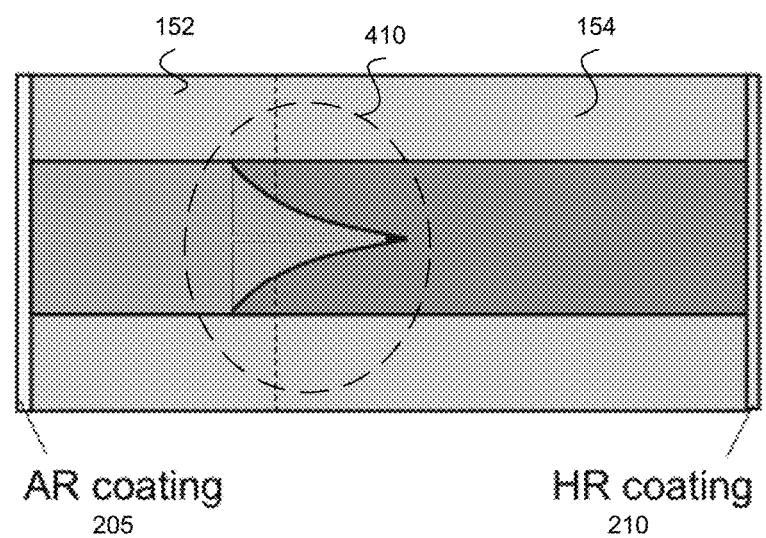
Figure 4C:
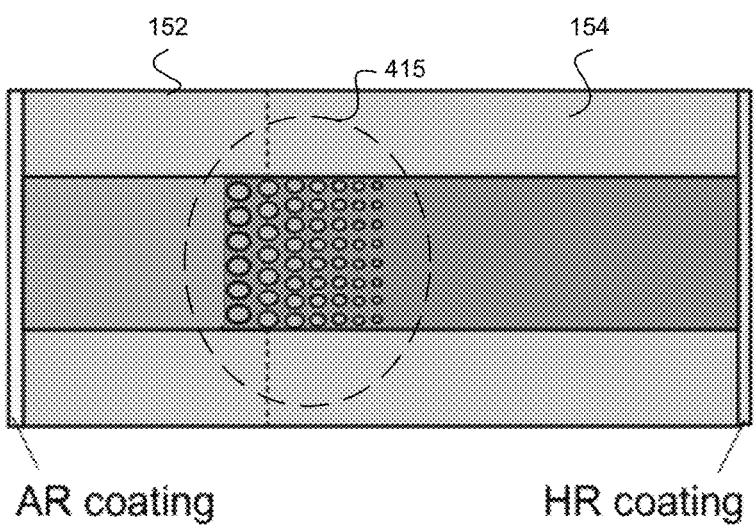

In some embodiments, the laser semiconductor system 100 may include a taper transition between two adjacent sections of the plurality of sections 150, see also FIG. 4A, 4B, 4C. For example, between a front section 152 and a rear section 154 when they are adjacent. In some embodiments, the laser semiconductor system 100 may include a lateral structuring.

A taper transition between adjacent sections of the plurality of sections 150 may generally indicate a gradual change/transition of some physical property between adjacent sections. For example, it may indicate that one section may become gradually smaller or thinner towards another section, in some dimension. A taper transition may also indicate that some physical property may gradually reduce in amount, intensity, or degree between adjacent sections. For example, it may indicate that one section may become gradually less doped towards a neighboring adjacent section. A taper transition may also indicate a gradual increase or decrease in width, thickness, or a tapering shape, form, or figure. Thus, in the context of semiconductor lasers, a taper transition between adjacent semiconductor sections may refer to a gradual change of a physical property of a semiconductor laser as it transitions from one section to another. The taper transition may be characterized in that the change is not abrupt, but rather a smooth transition over a certain distance.

A taper transition may be advantageous to avoid optical losses from a mode mismatch between adjacent sections. In lasers, the light emitted from the active region may need to be efficiently coupled into the waveguide. A taper transition may help to match the mode profile of the light to the waveguide, thus reducing losses and improving the overall efficiency of the laser semiconductor system 100. In some cases, it may also be desirable to change the size of the laser beam spot. A taper transition may be used to gradually expand or contract a beam spot. In accordance with various embodiments, a taper transition may also be used to match the impedance of different sections, reducing reflections, and improving signal transmission. Furthermore, a taper transition may help to reduce stress between physically changing adjacent sections of the semiconductor, for example a change in a layer thickness.

In some embodiments, a length of each section of the plurality of sections 150 may be monotonically decreasing or increasing in each of the sections 150 in the direction from the rear section 154 to the front section 152.

In some embodiments, the thickness of the p-side waveguide layer 140 in the front section 152 may differ from the thickness of the p-side waveguide layer 140 in the rear section 154 by more than a $\frac{1}{30}$ of a wavelength and by less than $\frac{1}{3}$ of a wavelength. In some embodiments, a resistivity of each section of the plurality of sections 150 may be monotonically decreasing in each of the sections 150 in the direction from the rear section 154 to the front section 152.

In some embodiments, the resistivity of the front section 152 may differ from the resistivity of the rear section 154 by more than a $\frac{1}{30}$ and by less than $\frac{1}{3}$ of the resistivity of the front section 154. In some embodiments, a thickness of the active region 120 may be unequal for two or more sections of the plurality of sections 150. In some embodiments, a thickness of the active region 120 of each section of the plurality of sections 150 may be monotonically decreasing in each of the sections 150 in the direction from the rear section 154 to the front section 152.

FIG. 2 shows an exemplary cross-section of a laser semiconductor system 100. There is shown an n-side layer 110, an active region 120, a cladding layer 130, a p-side waveguide layer 140, a plurality of sections 150, with a front section 152 and a rear section 154 illustrated. There is further shown an anti-reflective coating 205 and a highly-reflective coating 210 at the facets of the ends of the laser semiconductor system 100, and non-absorbing mirror (NAM) regions 220 and 230, i.e., the spaces between coatings 205, 210 at the facets, and the ends of the layers 120, 140. Same numerals as in previous figures denote similar features. The NAM sections 220, 230 may act as a mirror at the end of the laser semiconductor system 100 cavity, enhancing laser gain and efficiency. The NAM sections 220, 230 may be formed by removing the active region at the front and/or rear facets of the laser semiconductor system 100 and enhance facet stability. As will be known to the person skilled in the art, the NAM sections 220, 230 are optional.

In accordance with various embodiments, the front section 152 is characterized by a thinner waveguide layer 140 compared to the rear section 154. A thinner waveguide layer 140 may result in a lower confinement factor and higher injection in the front section 152.

By removing part of the p-side waveguide layer 140, the field intensity maximum may be pushed away from the active region 120, resulting in a lower confinement factor. Similarly, higher injection may result from a lower resistance in a thinner p-side waveguide layer 140.

Conversely, a thicker p-side waveguide layer 140 in the rear section 154 may lead to the field intensity maximum to be closer to the active region 120, resulting in a higher confinement factor. Lower injection may result from a higher resistance in a thicker p-side waveguide layer 140.

The cross-section of FIG. 2 illustrates one specific polarity arrangement of epitaxial growth layers and a reverse polarity, i.e., with an n-side acting as a waveguide (and varying thickness in different sections) is equally possible.

Figure 3:
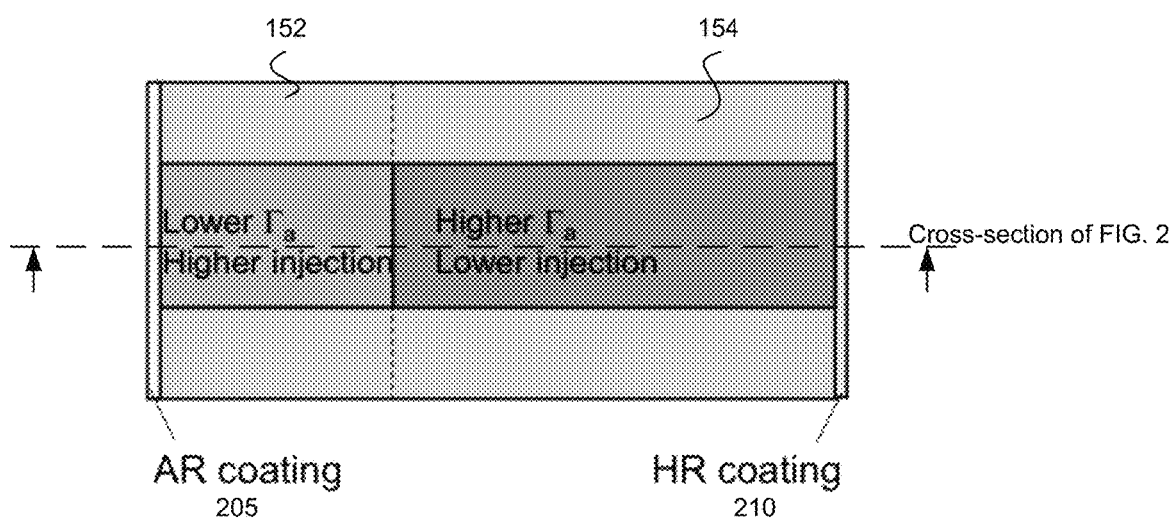
FIG. 3 shows an exemplary top view of the laser semiconductor system 100 shown in FIG. 2.

FIG. 3 shows an exemplary top view of the laser semiconductor system 100 shown in FIG. 2, without a taper transition between front section 152 and rear section 154. Same numerals as in previous figures denote similar features.

FIG. 4A, FIG. 4B, FIG. 4C show exemplary taper transitions 405, 410, 415 between a front section 152 and a rear section 154 in a top view of the laser semiconductor system 100, in accordance with various embodiments. Same numerals as in previous figures denote similar features.

As previously described, a taper transition 405, 410, 415 between adjacent sections of the plurality of sections 150 may generally indicate a gradual change/transition of some physical property between adjacent sections. For example, it may indicate that one section may become gradually smaller or thinner towards another section, in some dimension, as illustrated in FIG. 4A and FIG. 4B. A taper transition may also indicate that some physical property may gradually reduce in amount, intensity, or degree between adjacent sections, as illustrated in FIG. 4C. Thus, in the context of semiconductor lasers, a taper transition 405, 410, 415 between adjacent semiconductor sections may refer to a gradual change of a physical property of a semiconductor laser system 100 as it transitions from one section to another, for example from front section 152 to rear section 154, as illustrated in FIGS. 4A, 4B, 4C. The taper transitions 405, 410, 415 may be characterized in that the change is not abrupt, but rather a smooth transition over a certain distance.

Figure 5:
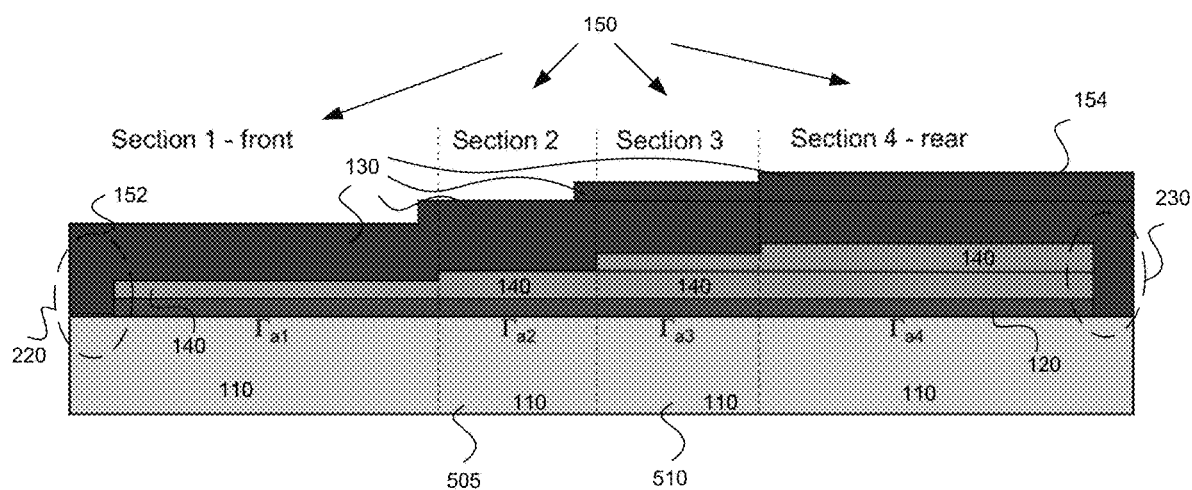
FIG. 5 shows an exemplary multi-section cross-section of a laser semiconductor system 100, in accordance with some embodiments of the present disclosure.

FIG. 5 shows an exemplary multi-section cross-section of a laser semiconductor system 100, in accordance with various embodiments. Same numerals as in previous figures denote similar features.

There is shown a plurality of sections 150, comprising a front section 152, a rear section 154, and intermediate sections 505, 510. The plurality of sections 150 may be characterized by a different thickness of the p-side waveguide layer 140, for example. Accordingly, the confinement factor may be different in different sections 150. In accordance with various embodiments, the thickness of the p-side waveguide layers 140 may be monotonically increasing from the front section 152 to the rear section 154. Moreover, as illustrated in FIG. 5, the length of the plurality of sections 150 may vary. For example, an exemplary longer front section 152 and an exemplary shorter intermediate section 505 is illustrated.

The use of a plurality of sections 150 may allow finer control of e.g., the confinement factor, and provide a form of taper transition. As will be understood by the person skilled in the art, any number of sections 150 may be used in a laser semiconductor system 100. The transitions between the sections 150 may avoid excessive optical losses at the interfaces of adjacent sections. As illustrated in FIGS. 4A, 4B, 4C, any type of taper transition between adjacent sections 150 may be envisaged.

In accordance with various embodiments, the disclosure may be advantageous for controlling slow axis divergence, particularly in broad area lasers. The semiconductor laser system 100 may be structured in the lateral direction to tailor current injection and/or optical confinement in a lateral direction in one or more sections 150 of the laser semiconductor device 100. With a desirable taper transition design, the mode selection in a lateral direction may be improved to reduce the number of amplified modes, thereby reducing the slow axis divergence in broad area lasers.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A laser semiconductor system, said system comprising:
an n-side layer, an active region, a p-side waveguide layer, and a cladding layer;
a plurality of sections, comprising at least a front section at the front of said semiconductor and a rear section at the rear of said semiconductor; and
wherein a thickness of said p-side waveguide layer is monotonically increasing in each of said plurality of sections in the direction from said front section to said rear section.

2. The system of claim 1, comprising an anti-reflective coating at said front and/or rear of said semiconductor, and a highly reflective coating at said rear and/or front of said semiconductor.

3. The system of claim 1, comprising a taper transition between two adjacent sections of said plurality of sections.

4. The system of claim 1, comprising a lateral structuring.

5. The system of claim 1, comprising one or more NAM sections.

6. The system of claim 1, wherein said active region is one of a bulk active region, a quantum well active region, or a quantum dot active region.

7. The system of claim 1, wherein a confinement factor of an optical field of said active region in said front section differs from a confinement factor of an optical field of said active region in said rear section by at least 10%.

8. The system of claim 1, wherein a length of each section of said plurality of sections is monotonically decreasing in each of said sections in the direction from said rear section to said front section.

9. The system of claim 1, wherein said thickness of said p-side waveguide layer in said front section differs from said thickness of said p-side waveguide layer in said rear section by more than a $1/30$ of a wavelength of a desired laser emission and by less than $1/3$ of a wavelength of a desired laser emission.

10. The system of claim 1, wherein a resistivity of each section of said plurality of sections is monotonically decreasing in each of said sections in the direction from said rear section to said front section.

11. The system of claim 1, wherein said resistivity of said front section differs from said resistivity of said rear section by more than a 1/30 and by less than 1/3 of said resistivity of said front section.

12. The system of claim 1, wherein a thickness of said active region is unequal for two or more sections of said plurality of sections.

13. The system of claim 1, wherein a thickness of said active region of each section of said plurality of sections is monotonically decreasing in each of said sections in the direction from said rear section to said front section.

14. The system of claim 1, wherein said laser semiconductor is operable in reverse polarity.

15. The system of claim 14, wherein said n-side layer acts as a waveguide and wherein said thickness of said n-side layer is monotonically increasing or decreasing in each of said plurality of sections in the direction from said front section to said rear section.

16. The system of claim 14, wherein said thickness of said p-side waveguide layer is substantially the same across said plurality of sections.

* * * * *